US 6,734,501 B2

(12) United States Patent
Sugano et al.

(10) Patent No.: US 6,734,501 B2
(45) Date of Patent: May 11, 2004

(54) FULLY INVERTED TYPE SOI-MOSFET CAPABLE OF INCREASING THE EFFECTIVE MUTUAL CONDUCTANCE

(75) Inventors: Takuo Sugano, 2-2-3, Sakura, Setagaya-ku, Tokyo-to (JP); Toru Toyabe, 2-1304, Nishi, 3369, Katsuse, Fujimi-shi, Saitama-ken (JP); Tatsuro Hanajiri, 607, Ikusukoa-Sakurashinmachi, 3-2-3, Shinmachi, Setagaya-ku, Tokyo-to (JP); Akira Saito, Yamatokooriyama (JP); Yoshiro Akagi, Osaka (JP)

(73) Assignees: Takuo Sugano, Tokyo-to (JP); Toru Toyabe, Saitama-ken (JP); Tatsuro Hanajiri, Tokyo-to (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/058,221

(22) Filed: Jan. 29, 2002

(65) Prior Publication Data
US 2002/0100938 A1 Aug. 1, 2002

(30) Foreign Application Priority Data
Jan. 30, 2001 (JP) ........................................ 2001-021582

(51) Int. Cl.[7] ........................................... H01L 31/0392
(52) U.S. Cl. ...................... 257/347; 257/327; 257/348
(58) Field of Search ................. 257/347, 327, 257/205, 288, 348; 438/301

(56) References Cited

U.S. PATENT DOCUMENTS

| | | | | |
|---|---|---|---|---|
| 4,954,855 A | * | 9/1990 | Mimura et al. | 257/61 |
| 5,418,391 A | * | 5/1995 | Huang | 257/336 |
| 6,043,536 A | * | 3/2000 | Numata et al. | 257/347 |

FOREIGN PATENT DOCUMENTS

| | | |
|---|---|---|
| JP | A-05-226660 | 9/1993 |
| JP | A-08-227997 | 9/1996 |
| JP | A-08-298328 | 11/1996 |
| JP | A-08-330601 | 12/1996 |
| JP | A-11-284301 | 10/1999 |

* cited by examiner

Primary Examiner—George Eckert
Assistant Examiner—Matthew C. Landau
(74) Attorney, Agent, or Firm—Nixon & Vanderhye P.C.

(57) ABSTRACT

A fully inverted type SOI-MOSFET has a channel region 18 constructed of a portion that belongs to a top silicon layer 13 and is located just under a gate electrode 15 and a source region 16 and a drain region 17, which belong to the top silicon layer 13 and are located adjacent to this channel region 18. The channel region 18 is inverted throughout the entire thickness during operation. The source region 16 has a source resistance $R_S$, which satisfies a relation that $(1/g_m) > R_S$ with respect to the mutual conductance $g_m$ of the channel region 18 itself. According to this fully inverted type SOI-MOSFET, the effective mutual conductance ($G_m$) can be increased.

16 Claims, 10 Drawing Sheets

| FIXED PARAMETER | | CONDITION | VARIABLE PARAMETER | |
|---|---|---|---|---|
| | | | $\Delta x$ [μm] | $t_{Si}$ [nm] |
| $t_{FOX}$ | 7 [nm] | A | 0.01 | 1 |
| $t_{BOX}$ | 1 [μm] | B | 0.01 | 5 |
| $L_G$ | 0.1 [μm] | C | 0.05 | 1 |
| W | 10 [μm] | D | 0.1 | 1 |
| | | E | 0.1 | 5 |

FULLY INVERTED TYPE SOI-MOSFET CAPABLE OF INCREASING THE EFFECTIVE MUTUAL CONDUCTANCE

BACKGROUND OF THE INVENTION

The present invention relates to a fully inverted type SOI-MOSFET.

Herein, the term of "SOI-MOSFET" means a field-effect transistor that employs a silicon layer provided via an insulating layer on a substrate (this layer is referred to as a "top silicon layer") as an active region. A gate electrode is provided on the top silicon layer via a gate oxide film. A portion that belongs to the top silicon layer and corresponds to a portion located just under the gate electrode becomes a channel region, and portions located adjacently on both sides of this channel region become a source region and a drain region. The "fully inverted type" means a type such that the channel region is inverted throughout the entire thickness (the entire region in the direction of thickness) during operation.

Figure 11A:
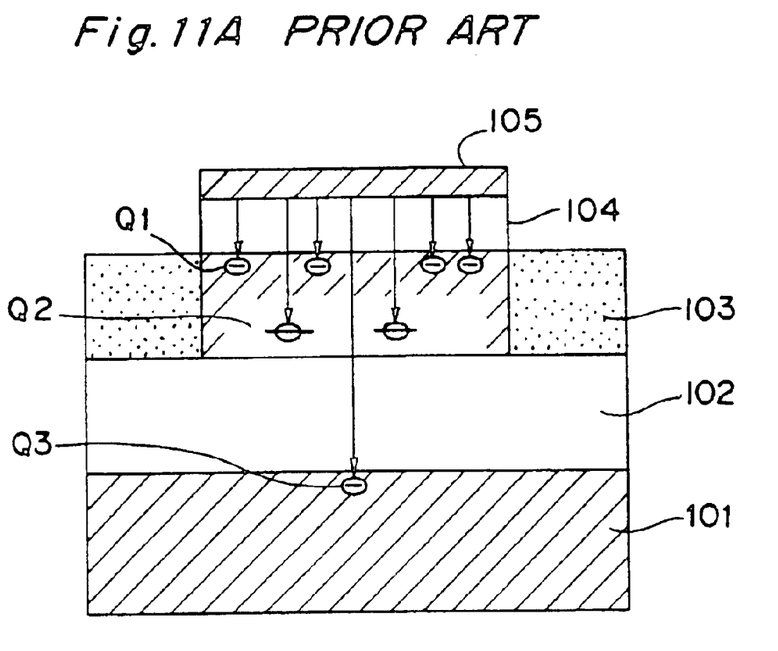
FIGS. 11A and 11B show the conventional type SOI-MOSFET and fully inverted type SOI-MOSFET.

As well-known, there is a short-channel effect as a serious problem in accordance with developments in fine structure generally in MOSFET's (MOS type field-effect transistor) and accordingly in SOI-MOSFET's. This short-channel effect itself can be overcome by increasing the impurity concentration in the substrate. If such an arrangement is adopted, there is caused another problem that the threshold voltage rises. In contrast to this, in the fully inverted type SOI-MOSFET, the short-channel effect can be overcome without increasing the impurity concentration nor making the threshold voltage rise (Japanese Patent Laid-open Publication No. HEI 11-284201). That is, in the conventional type SOI-MOSFET shown in FIG. 11A, a line of electric force that has originated from a gate electrode 105 via a gate oxide film 104 terminates in a channel carriers Q1 and ionized impurities Q2 inside a top silicon layer 103 and terminates in impurities Q3 inside a silicon substrate 101 through an embedded oxide film 102. However, in the fully inverted type SOI-MOSFET shown in FIG. 11B, an embedded oxide film 102A is increased in film thickness, and a top silicon layer 103A is reduced in film thickness. Therefore, a channel region 118 that belongs to the top silicon layer 103A and corresponds to a portion located just under the gate electrode 105 is inverted through the entire thickness (the entire region in the direction of thickness), and almost all the lines of electric force that have originated from the gate electrode 105 via the gate oxide film 104 terminate in the channel carriers Q1 inside the top silicon layer 103A. Therefore, in the fully inverted type SOI-MOSFET, the controllability of the channel charges by the gate electric field can be improved, and the short-channel effect can be restrained.

Describing in concrete, the SOI-MOSFET generally has the following three types of operation modes depending on the state inside the top silicon layer. The operation modes include (1) a partially depleted type such that an inversion layer, a depletion layer and a neutral region exist inside a top silicon layer similarly to the bulk MOSFET, (2) a fully depleted type such that only an inversion layer and a depletion layer exist and (3) a fully inverted type such that only an inversion layer is formed. For example, in case that the impurity concentration in the channel region is $N_A=10^{17}$ cm$^{-3}$, there is resulting the (1) partially depleted type when the thickness of the top silicon layer is greater than 1 $\mu$m, the (2) fully depleted type when the thickness is not smaller than 100 nm and not greater than 1 $\mu$m and the (3) fully inverted type when the thickness is not greater than 10 nm. When the impurity concentration in the channel region differs from $N_A=10^{17}$ cm$^{-3}$, the widths of the depletion layer and the inversion layer are varied, and therefore, the thickness of the top silicon layer that enters each operation mode is also varied. The neutral region and the depletion layer are removed by reducing the film thickness of the top silicon layer, by which the controllability of the inversion layer by the gate electric field is improved to restrain the short-channel effect. Even in the case of a MOSFET of the partially depleted type (1) having a channel length that causes the short-channel effect, the short-channel effect is restrained with the provision of the fully depleted type of (2). Furthermore, even in the case of the MOSFET of this fully depleted type having a channel length that causes the short-channel effect, the short-channel effect is restrained with the provision of the fully inverted type of (3). As described above, in the fully inverted type SOI-MOSFET, the short-channel effect is restrained to enable the threshold voltage to be easily controlled.

Figure 4:
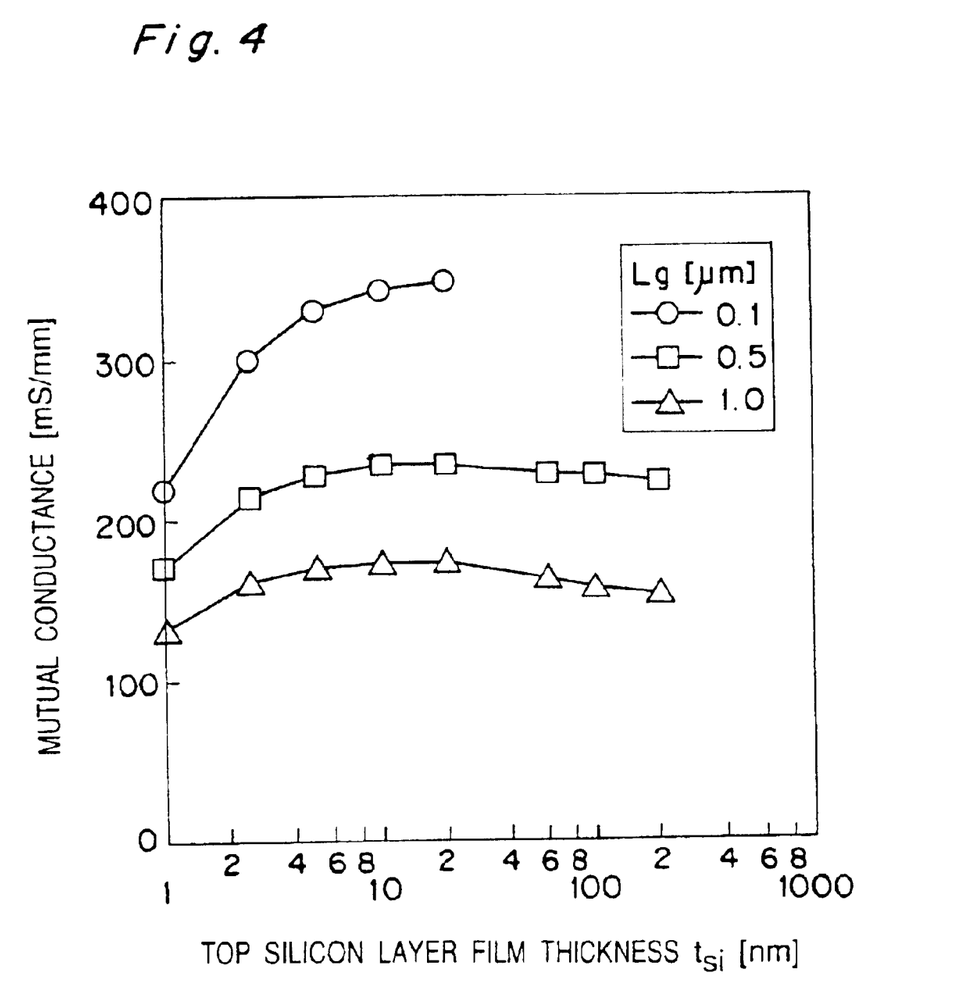
FIG. 4 is a graph showing a top silicon layer thickness ($t_{Si}$) dependency of the effective mutual conductance ($G_m$) obtained by three-dimensional device simulation.
Figure 11B:
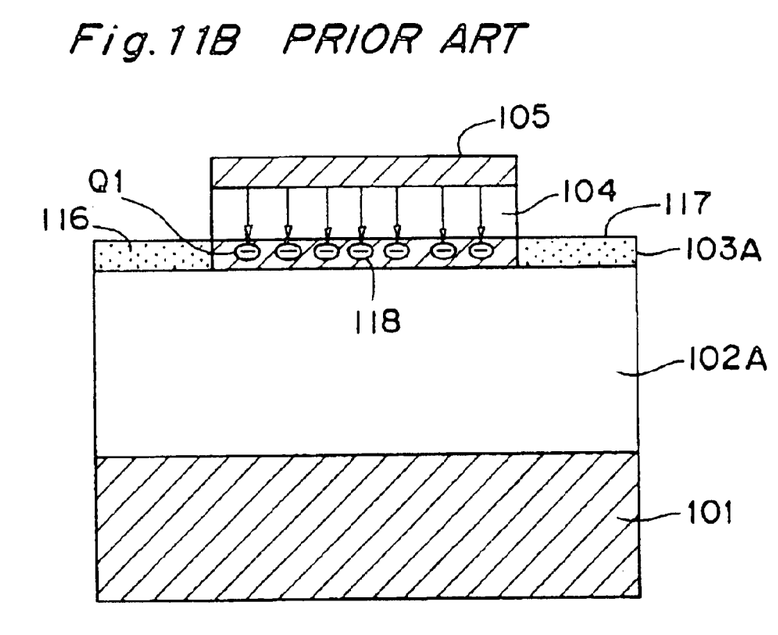

An effective mutual conductance $G_m$ during the device operation depends on not only a mutual conductance $g_m$ when only the channel region is taken into consideration but also a source resistance $R_S$. The effective mutual conductance $G_m$ of the entire device is expressed as:

$$G_m = g_m/(1+R_S g_m) \tag{1}$$

by the mutual conductance $g_m$ of the channel region and the source resistance $R_S$. The source resistance $R_S$ is expressed as:

$$RS \sim \rho_s L/d \tag{2}$$

by a width d in a direction perpendicular to the channel direction of the diffusion layer, a length L in a direction that coincides with the channel direction and a sheet resistance $\rho_s$. In the above-mentioned fully inverted type SOI-MOSFET, the top silicon layer 103A is reduced in film thickness so that the top silicon layer 103A is inverted throughout the entire thickness. Therefore, a source region 116 and a drain region 117, which belong to the top silicon layer 103A and are located adjacent to a channel region 118, are concurrently reduced in film thickness. Therefore, in the above-mentioned fully inverted type SOI-MOSFET, the sheet resistance $\rho_s$ is increased to increase the source resistance $R_S$. The increase in the source resistance $R_S$ cancels the increase in the mutual conductance $g_m$ of the channel region, and this leads to a problem that the effective mutual conductance $G_m$ and accordingly a current drive power is not increased in spite of the intention. According to the results of calculation carried out by the present inventors by three-dimensional device simulation, as shown in FIG. 4, the effective mutual conductance $G_m$ is rather reduced when a film thickness $t_{Si}$ of the top silicon layer is reduced to 10 nm or less, and the current drive power is consequently reduced.

SUMMARY OF THE INVENTION

Accordingly, the object of the present invention is to provide a fully inverted type SOI-MOSFET capable of increasing the effective mutual conductance ($G_m$).

In order to achieve the aforementioned object, the present inventors paid attention to the reduction in resistance of the source region. In the standard semiconductor processes, the source region and the drain region are formed symmetrically on both sides of the channel region. However, from the point of view of mutual conductance based on the equation (1), there is no influence exerted even when the drain resistance is made different from the source resistance. Accordingly, there is required no specific consideration for a limitation on the drain region. It is to be noted that, as a realistic approach, the following analysis is based on the case where the source region and the drain region are formed symmetrically on both sides of the channel region.

Figure 5:
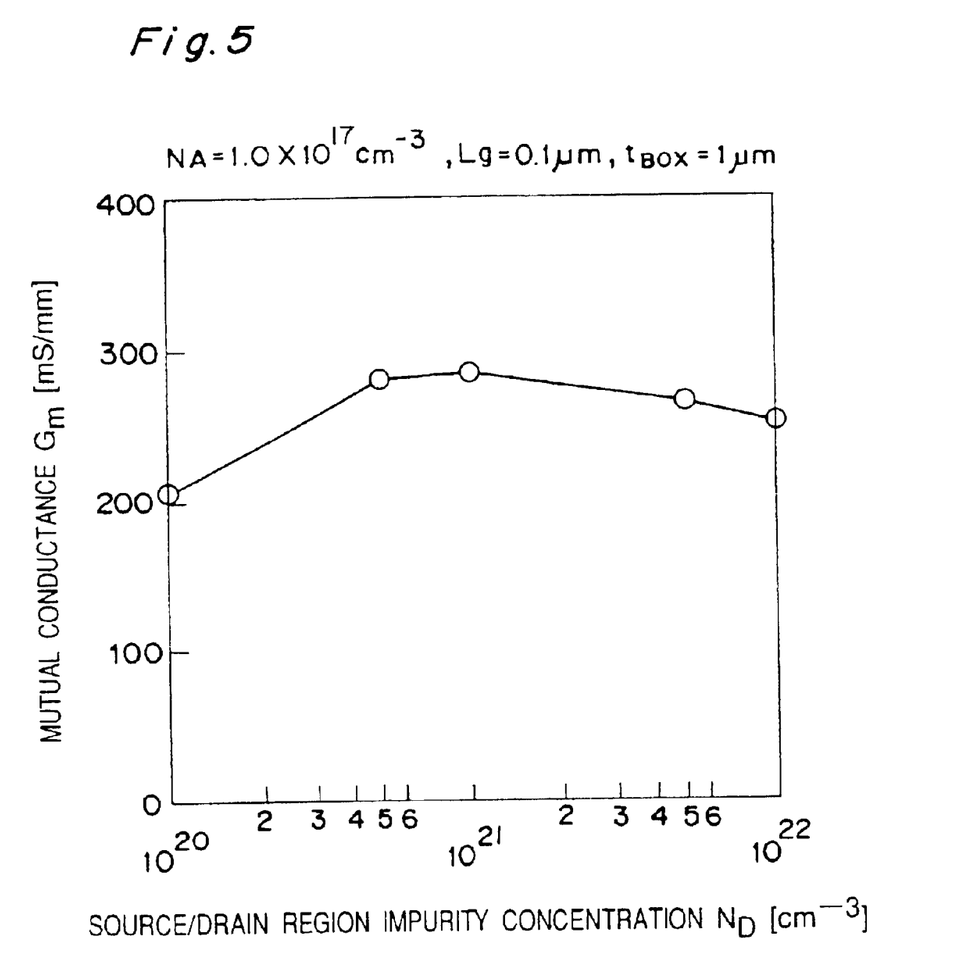
FIG. 5 is a graph showing a source/drain region impurity concentration ($N_D$) dependency of the effective mutual conductance ($G_m$) obtained by three-dimensional device simulation.
Figure 6:
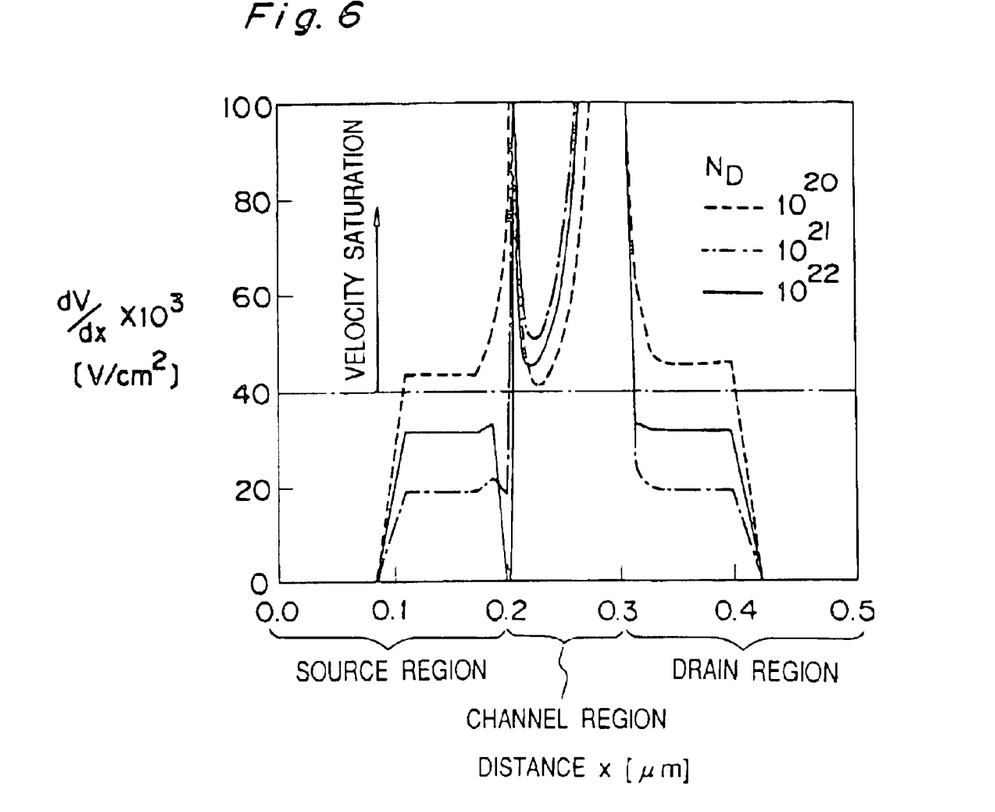
FIG. 6 is a graph showing an electric field intensity (dV/dx) in the direction of channel just under the gate oxide film, obtained by three-dimensional device simulation.

First of all, in order to reduce the resistance of the source region itself, the present inventors examined an increase in the impurity concentration of the source/drain region. According to the results of calculation carried out by the present inventors through the three-dimensional device simulation, as shown in FIG. 5, if the impurity concentration $N_D$ of the source/drain region is increased from $10^{20}$ cm$^{-3}$ to $10^{21}$ cm$^{-3}$, then the effective mutual conductance Gm is increased from about 200 mS/mm to 295 mS/mm. The reason for the above is considered to be ascribed to a reduction in the source resistance $R_S$ as a consequence of an increase in the impurity concentration of donor impurity of As, P or the like. It was also discovered that the effective mutual conductance $G_m$ reduced as the impurity concentration increased when the impurity concentration $N_D$ of the source/drain region exceeded $10^{21}$ cm$^{-3}$. The reason for the above is presumably ascribed to the appearance of an electric field component in a direction opposite to a carrier travel direction attributed to a built-in electric field at a boundary (pn junction) formed by the source region and the channel region. FIG. 6 shows an electric field intensity dV/dx (a value multiplied by $10^3$ is expressed in the unit V/cm) in the direction of channel just under the gate oxide film, obtained through calculation. A range in which x=0 to 0.2 μm, a range in which x=0.2 μm to 0.3 μm and a range in which x=0.3 μm to 0.5 μm correspond to the source region, the channel region and the drain region, respectively. As is apparent from FIG. 6, the electric field intensity dV/dx is extremely reduced when x=0.2 μm at the boundary between the source region and the channel region under the condition that the impurity concentration $N_D$ of the source/drain region is $10^{22}$ cm$^{-3}$. This indicates that an electric field component in the direction opposite to the carrier travel direction has appeared due to the built-in electric field at the pn junction located between the source region and the channel region. This result has substantiated the fact that the effective mutual conductance $G_m$ is increased when the impurity concentration $N_D$ of the source/drain region falls within the range of about $10^{20}$ cm$^{-3}$ to $10^{21}$ cm$^{-3}$ and that the effective mutual conductance $G_m$ is conversely reduced when the impurity concentration $N_D$ of the source/drain region exceeds $10^{21}$ cm$^{-3}$.

Figure 7:
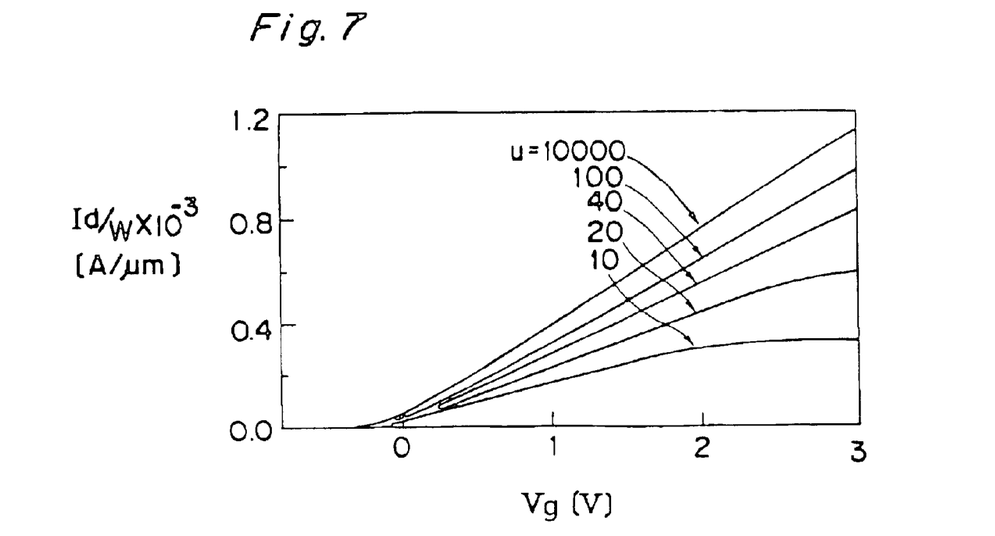
FIG. 7 is a graph showing a drain current (Id/W) per unit gate width with respect to a drain voltage (Vd) characteristic when a carrier mobility ($\mu$) of the source region is variably set.

Next, the present inventors examined the construction of the source/drain region of metallic suicide in order to reduce the resistance of the source region itself. FIG. 7 shows the characteristics of a drain current Id/W per unit gate width (a value multiplied by $10^{-3}$ is expressed in the unit A/gm) with respect to a gate voltage Vg (unit V) when a mobility μ is varied in steps as a parameter from about 10 to 10000 μm$^2$/Vsec. As is apparent from FIG. 7, the drain current Id increases as the mobility μ increases. In other words, the effective mutual conductance $G_m$ increases as the source resistance $R_S$ reduces. Therefore, if the source/drain region is constructed of metallic silicide, then the effective mutual conductance $G_m$ increases.

Figure 8A:
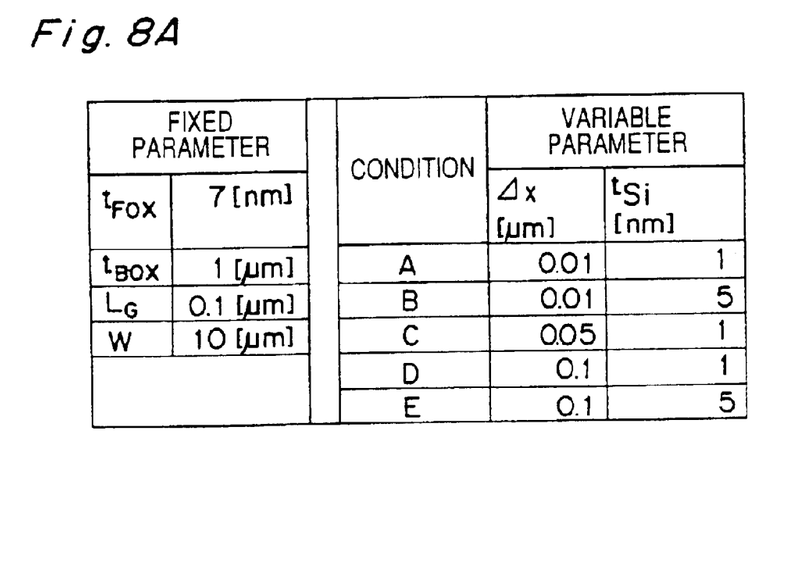
FIGS. 8A and 8B are explanatory views of dimensional parameters (including fixed parameters and variable parameters) of the device.
Figure 8B:
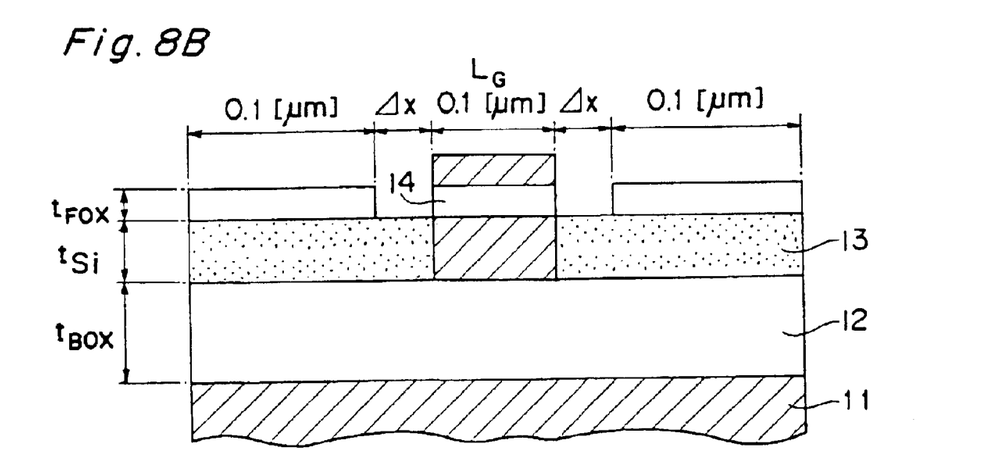
Figure 9:
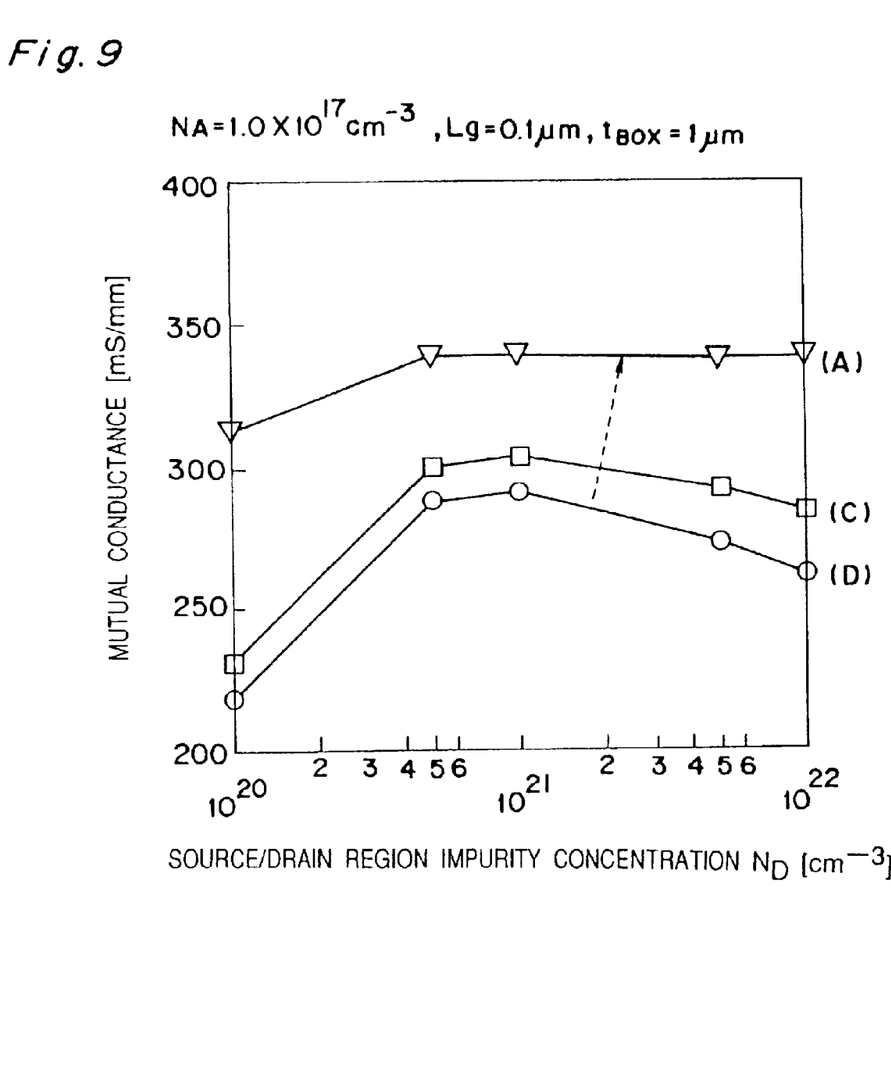
FIG. 9 is a graph showing the source/drain region impurity concentration ($N_D$) dependency of the effective mutual conductance ($G_m$) when a distance ($\Delta x$) in the direction of channel between the metal contact and the gate electrode on the source region is varied in steps.
Figure 10:
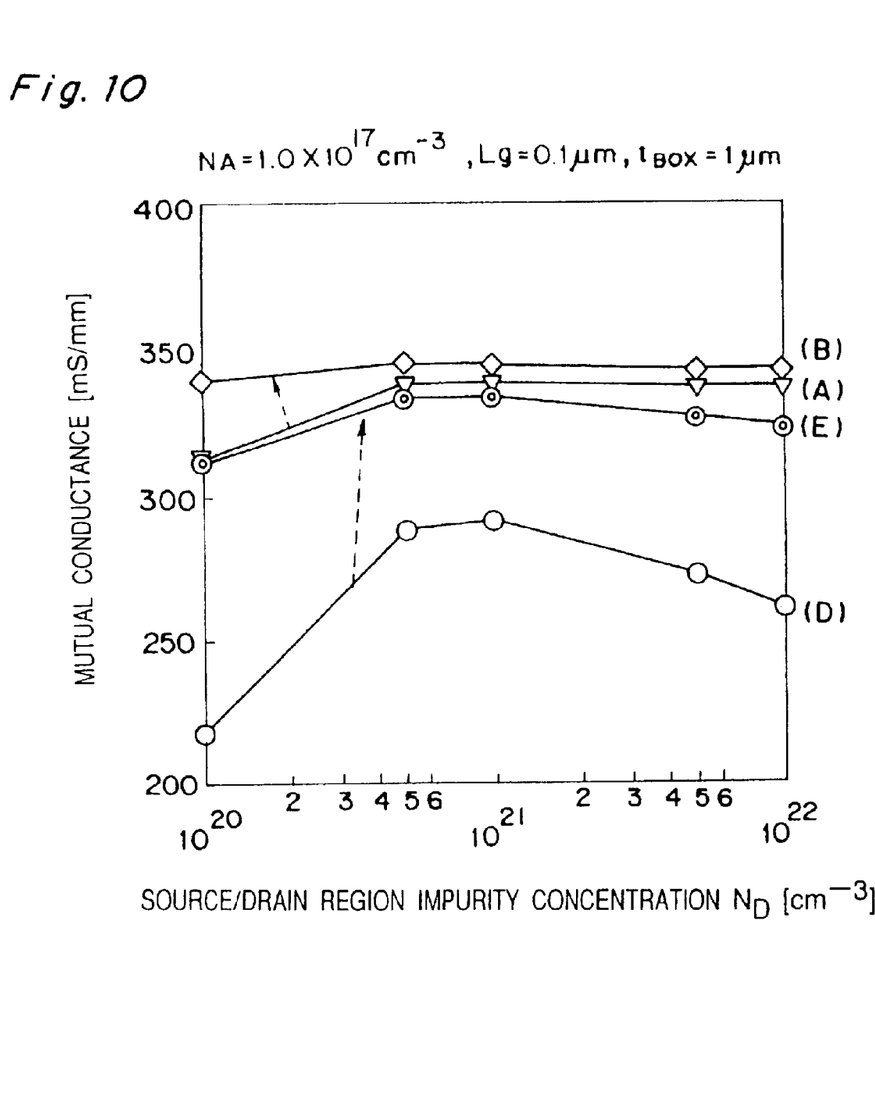
FIG. 10 is a graph showing the source/drain region impurity concentration ($N_D$) dependency of the effective mutual conductance ($G_m$) when the thickness of a top silicon layer is varied in steps.

Moreover, the present inventors examined the reduction in the resistance of the source region by varying the dimensional parameters of the device. As shown in FIGS. 8A and 8B, under the condition that a thickness $t_{FOX}$ of a gate oxide film 14 is fixed to 7 nm, a thickness $t_{BOX}$ of an embedded oxide film 12 is fixed to 1 μm, a gate length $L_G$ is fixed to 0.1 μm and a gate width W is fixed to 10 μm, a distance Δx in the direction of channel between a metal contact and a gate electrode in the source is varied in three steps of 0.01 μm, 0.05 μm and 0.1 μm, and the thickness $t_{Si}$ of a top silicon layer 13 (including the channel region and the source/drain region) is varied in two steps of 1 nm and 5 nm. FIG. 9 and FIG. 10 show the source/drain region impurity concentration ($N_D$) dependency of the effective mutual conductance $G_m$ (in the unit mS/mm) when the dimensional parameters are varied in steps as described above. As is apparent from FIG. 9, when the distance Δx in the direction of channel between the metal contact and the gate electrode is reduced in steps of 0.1 μm, 0.05 μm and 0.01 μm in correspondence with the conditions (D), (C) and (A) shown in FIG. 8A, the effective mutual conductance $G_m$ increases. Moreover, as is apparent from FIG. 10, when the thickness $t_{Si}$ of the top silicon layer 13 is increased from 1 nm to 5 nm in correspondence with the shift of conditions of FIG. 8A from (D) to (E) and (A) to (B), the effective mutual conductance $G_m$ increases. This result substantiated the fact that the mutual conductance $G_m$ was increased by locating the metal contact on the source region close to the gate electrode and increasing the film thickness of the top silicon layer.

From the above result of the analysis, according to the present invention, there is provided a fully inverted type SOI-MOSFET having a channel region constructed of a portion that belongs to a top silicon layer and is located just under a gate electrode and a source region and a drain region, which belong to the top silicon layer and are located adjacent to the channel region, the channel region being inverted throughout the entire thickness thereof during operation, wherein the source region has a source resistance ($R_S$), which satisfies a relation that $(1/g_m) > R_S$ with respect to a mutual conductance ($g_m$) of the channel region itself.

In the fully inverted type SOI-MOSFET of this invention, the source resistance ($R_S$) satisfies the relation that $(1/g_m) > R_S$ with respect to the mutual conductance ($g_m$) of the channel region itself. Therefore, the effective mutual conductance ($G_m$) can be improved on the basis of the aforementioned equation (1). As a result, a high-performance device of high current drive power and low consumption of power is obtained.

In one embodiment of the present invention, the source region has an impurity concentration set so that the source resistance ($R_S$) of the source region satisfies the relation that $(1/g_m) > R_S$ with respect to the mutual conductance ($g_m$) of the channel region itself.

In one embodiment of the present invention, the source region contains a metal in the composition thereof so that the source resistance ($R_S$) of the source region satisfies the relation that $(1/g_m) > R_S$ with respect to the mutual conductance ($g_m$) of the channel region itself.

In one embodiment of the present invention, the source region is made of metallic silicide.

In one embodiment of the present invention, the metallic silicide is comprised of at least one of a group consisting of tantalum silicide, niobium silicide, chromium silicide, cobalt silicide, nickel silicide, zirconia silicide, vanadium silicide, hafnium silicide, molybdenum silicide and platinum silicide.

In one embodiment of the present invention, a portion that belongs to the top silicon layer and constitutes the source region has a thickness greater than a thickness of a portion that constitutes the channel region so that the source resistance ($R_S$) satisfies the relation that $(1/g_m)>R_S$ with respect to the mutual conductance ($g_m$) of the channel region itself.

In one embodiment of the present invention, a distance ($\Delta x$) in a direction of channel between a metal contact and a gate electrode in the source region is reduced so that the source resistance ($R_S$) of the source region satisfies the relation that $(1/g_m)>R_S$ with respect to the mutual conductance ($g_m$) of the channel region itself.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The fully inverted type SOI-MOSFET of the present invention will be described in detail below on the basis of the embodiments thereof.

(First Embodiment)

Figure 1A:
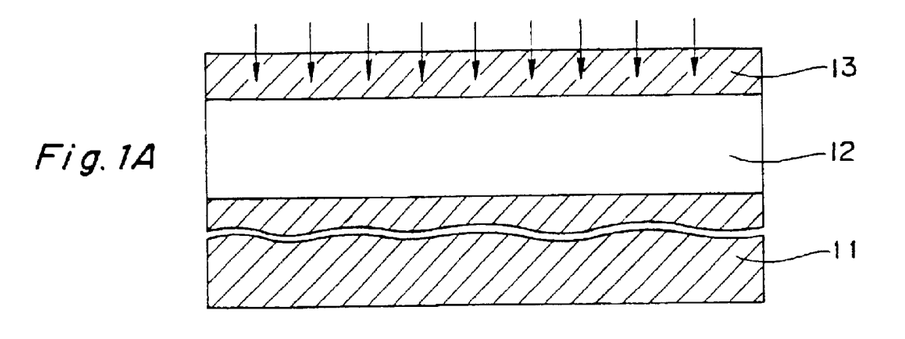
FIGS. 1A through 1C are views showing the fabricating processes of a fully inverted type SOI-MOSFET according to a first embodiment of the present invention.
Figure 1B:
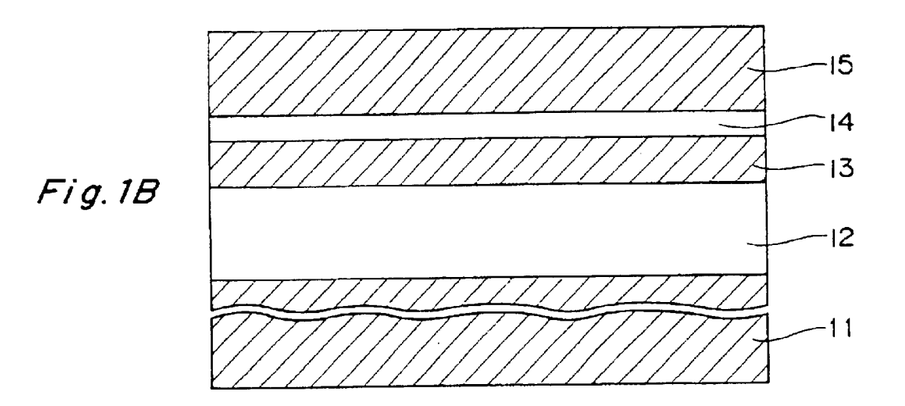
Figure 1C:
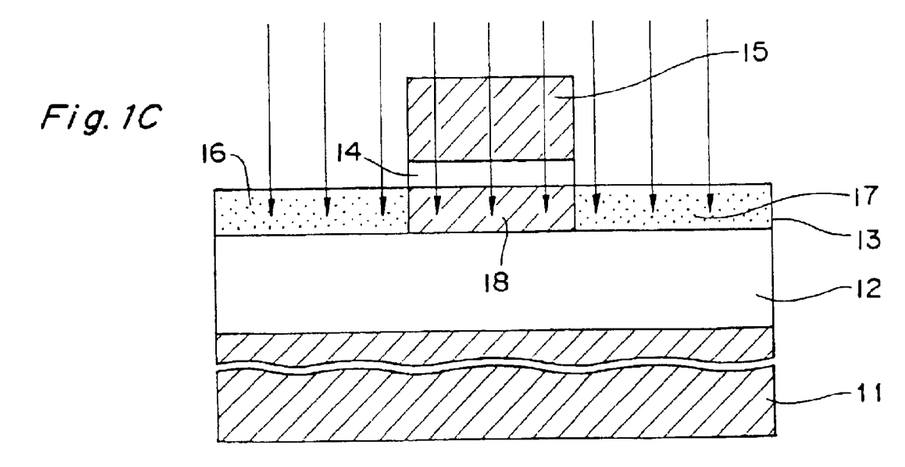

FIGS. 1A through 1C are views showing the processes for fabricating the fully inverted type SOI-MOSFET of the first embodiment.

As shown in FIG. 1A, an embedded oxide film 12 is formed as an insulating layer on the surface of a silicon substrate 11, and a top silicon layer 13 that becomes an active region is further formed on the surface of the embedded oxide film 12. The embedded oxide film 12 has a thickness $T_{BOX}$ set to a value of not smaller than about 50 nm. The top silicon layer 13 is made of polysilicon or single-crystal silicon. The thickness of top silicon layer 13 is set thinner than that of the general SOI-MOSFET (nonfully inverted type SOI-MOSFET) so that a channel region 18 shown in FIG. 1C is inverted throughout the entire thickness (the entire region in the direction of thickness) during operation after being completed. For example, the depth of the inversion layer is about 10 nm when the impurity concentration $N_A$ of the channel region 18 is set to $10^{19}$ cm$^{-3}$, and therefore, the thickness $t_{Si}$ of the top silicon layer 13 is set to about 1 nm to 5 nm. In this example, the thickness $t_{Si}$ of the top silicon layer 13 is assumed to be 1 nm.

First of all, in order to control the impurity concentration of the top silicon layer 13 and thereby control the threshold voltage of the transistor, ions are implanted into the entire surface of the top silicon layer 13. For example, $BF_2^-$ ions are implanted under the acceleration energy condition of about 15 keV. In order to set the threshold voltage to 0.2 to 0.6 V in this example, the dose at this time is set within a range of $0.5 \times 10^{12}$ cm$^{-2}$ to $3 \times 10^{12}$ cm$^{-2}$. Thereafter, the well-known annealing for activation is performed in order to activate the implanted $BF_2^-$ ions.

Next, as shown in FIG. 1B, thermal oxidation is performed to form a gate oxide film 14 on the surface of the top silicon layer 13. The thickness $T_{FOX}$ of the gate oxide film 14 is set to a value of not smaller than about 3 nm so that no gate tunnel current occurs during operation after the completion of the device.

Next, a polysilicon film 15 is deposited as a gate electrode material on the gate oxide film 14 by the chemical vapor deposition method. The thickness of the polysilicon film 15 is set within a range of about 100 nm to 200 nm. Subsequently, the well-known lithographic process with an electron beam or ultraviolet rays and an etching process are performed to process the gate oxide film 14 and the polysilicon film 15 according to a stripe-shaped pattern. Through these processes, a gate electrode 15 (denoted by the same reference numeral as that of the material for the sake of simplicity) constructed of part of the polysilicon film is formed.

Next, as shown in FIG. 1C, ions are implanted into the portions that belong to the top silicon layer 13 and correspond to both sides of the gate electrode 15 using the gate electrode 15 as a mask. For example, $As^+$ ions are implanted under the conditions of an acceleration energy of 40 keV and a dose of $5 \times 10^{15}$ cm$^{-2}$. Thereafter, the well-known annealing for activation is performed in order to activate the implanted $As^+$ ions. Through this process, the conductivity of the gate electrode 15 is improved, and the portions that belong to the top silicon layer 13 and correspond to both sides of the gate electrode 16 are formed into a source region 16 and a drain region 17 of a high impurity concentration. According to the dose of $5 \times 10^{15}$ cm$^{-2}$, the final impurity concentration $N_D$ of the source region 16 and the drain region 17 falls within a range of about $1 \times 10^{20}$ to $1 \times 10^{21}$ cm$^{-3}$. Therefore, the source resistance $R_S$ can be made lower than in the conventional case, and the source resistance $R_S$ comes to satisfy the relation that $(1/g_m)>R_S$ with respect to the mutual conductance $g_m$ of the channel region 18 itself.

Subsequently, although not shown in the drawings, a protective coat is deposited on the entire surface by the chemical vapor deposition method. By forming a contact hole in each of the portions that belong to this protective coat and are located above the source region 16, the drain region 17 and the gate electrode 15 and performing the well-known metallic wiring process, metal interconnections connected to the source region 16, the drain region 17 and the gate electrode 15 are formed.

In the fully inverted type SOI-MOSFET fabricated as described above, the relation that $(1/g_m)>R_S$ with respect to the mutual conductance $g_m$ of the channel region 18 itself is satisfied, and therefore, the effective mutual conductance $G_m$ becomes high on the basis of the aforementioned equation (1).

(Second Embodiment)

Figure 2A:
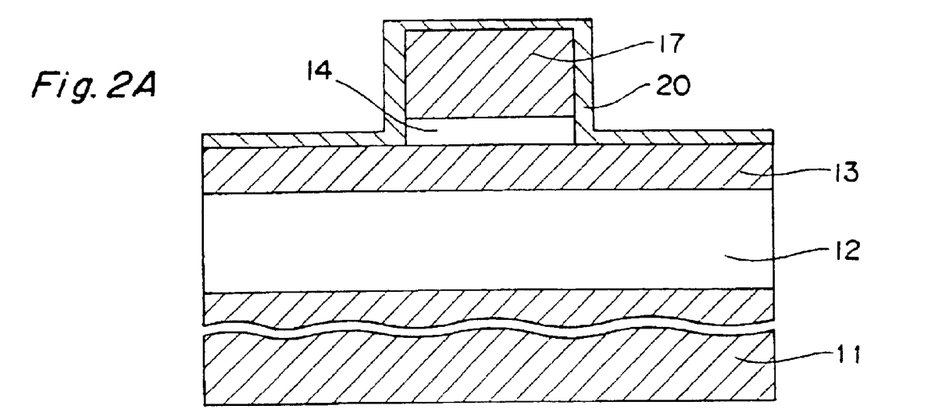
FIGS. 2A through 2C are views showing the fabricating processes of a fully inverted type SOI-MOSFET according to a second embodiment of the present invention.
Figure 2B:
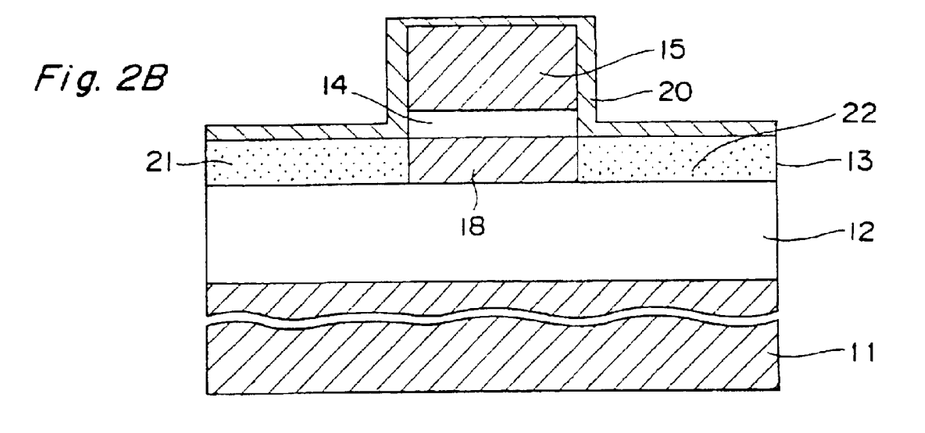
Figure 2C:
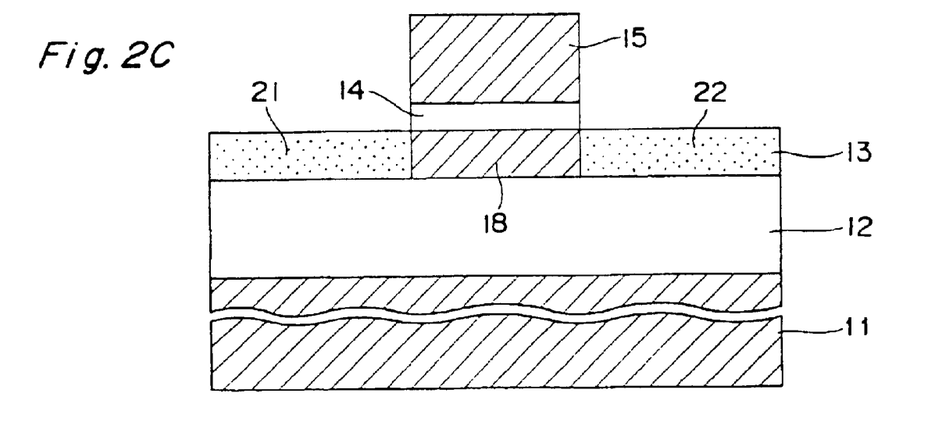

FIGS. 2A through 2C show the processes for fabricating the fully inverted type SOI-MOSFET of the second embodiment. It is to be noted that the same components as the components in FIG. 1 are denoted by the same reference numerals.

As shown in FIG. 2A, an embedded oxide film 12 is formed as an insulating layer on the surface of a silicon substrate 11, and a top silicon layer 13 that becomes an active region is further formed on the surface of the embedded oxide film 12. A gate oxide film 14 and a polysilicon film 15 are processed according to a stripe-shaped pattern, and the processes are carried out similarly to the fabricating processes of the fully inverted type SOI-MOSFET of the first embodiment until the formation of a gate electrode 15 (denoted by the same reference numeral as that of the material for the sake of simplicity) constructed of part of the polysilicon film is formed.

Subsequently, a nickel film 20 is deposited as a metal on the entire surface of the above-mentioned film, covering the upper surface and the side surfaces of the gate electrode 15 and the surface of the portions that belong to the top silicon layer 13 and correspond to both sides of the gate electrode 15. In this example, the thickness of the nickel film 20 is set equal to the thickness of the top silicon layer 13.

Next, as shown in FIG. 2B, annealing is performed at a temperature of 650° C., so that the gate electrode 15 is made to be nickel-silicide and the portions that belong to the top silicon layer 13 and correspond to both sides of the gate electrode 15 are made to be nickel-silicide. Through this process, the conductivity of the gate electrode 15 is improved, and the portions that belong to the top silicon layer 13 and correspond to both sides of the gate electrode 15 are processed into a source region 21 and a drain region 22 in a self-aligning manner. The source region 21 and the drain region 22 include a high-concentration metal in the compositions thereof, and therefore, the source resistance $R_S$ comes to satisfy the relation that $(1/g_m)>R_S$ with respect to the mutual conductance $g_m$ of the channel region 18 itself.

Next, as shown in FIG. 2C, the nickel film 20 left unreacted without contributing to the slicide-forming is removed by means of, for example, sulfuric acid, nitric acid, an acetic acid mixed liquid or the like.

Subsequently, although not shown in the figure, a protective coat is deposited on the entire surface by the chemical vapor deposition method similarly to the fabricating process of the fully inverted type SOI-MOSFET of the first embodiment. By forming a contact hole in the portions that belong to this protective coat and are located on the source region 21, the drain region 22 and the gate electrode 15 and performing the well-known metallic wiring process, metallic interconnections connected to the source region 21, the drain region 22 and the gate electrode 15 are formed.

In the fully inverted type SOI-MOSFET fabricated as described above, the source resistance $R_S$ satisfies the relation that $(1/g_m)>R_S$ with respect to the mutual conductance $g_m$ of the channel region 18 itself. Therefore, the effective mutual conductance $G_m$ becomes high on the basis of the aforementioned equation (1).

(Third Embodiment)

Figure 3A:
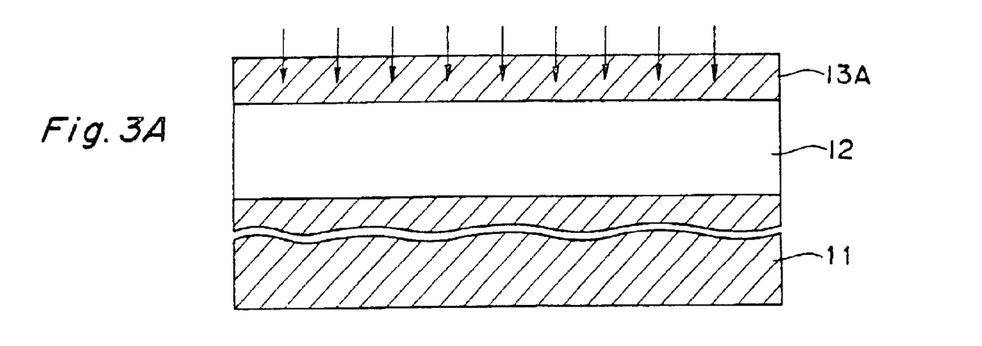
FIGS. 3A through 3C are views showing the fabricating processes of a fully inverted type SOI-MOSFET according to a third embodiment of the present invention.
Figure 3B:
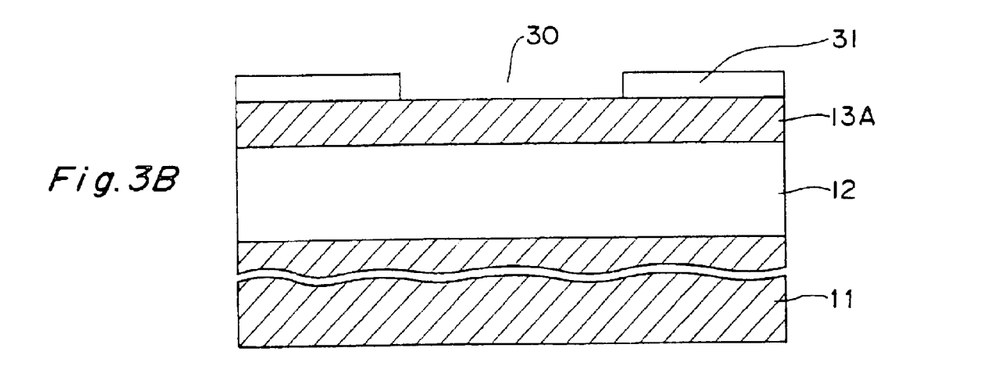
Figure 3C:
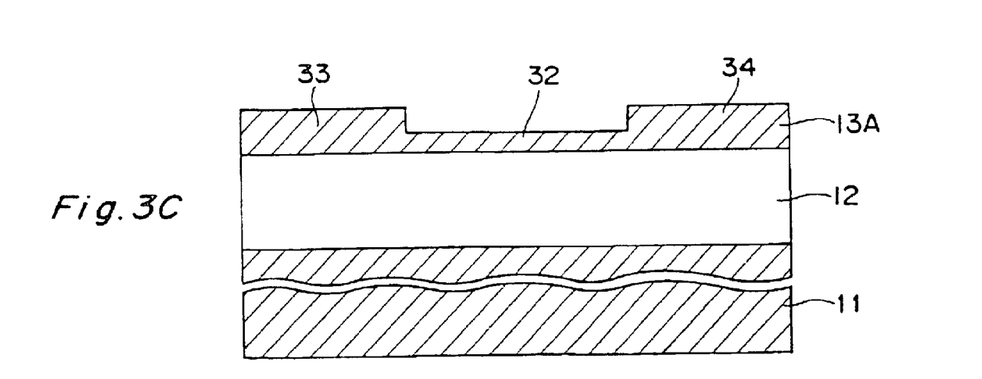

FIGS. 3A through 3C show the processes for fabricating the fully inverted type SOI-MOSFET of the third embodiment. It is to be noted that the same components as the components in FIG. 1 are denoted by the same reference numerals.

As shown in FIG. 3A, an embedded oxide film 12 is formed as an insulating layer on the surface of a silicon substrate 11, and a top silicon layer 13A that becomes an active region is further formed on the surface of the embedded oxide film 12. In this example, the thickness $t_{Si}$ of the top silicon layer 13A is assumed to be 2 nm.

First of all, in order to control the impurity concentration of the top silicon layer 13A and thereby control the threshold voltage of the transistor, ions are implanted into the entire surface of the top silicon layer 13A. For example, $BF_2^-$ ions are implanted under the acceleration energy condition of about 15 keV. In order to set the threshold voltage to 0.2 to 0.6 V in this example, the dose at this time is set within a range of $0.5 \times 10^{12}$ cm$^{-2}$ to $3 \times 10^{12}$ cm$^{-2}$. Thereafter, the well-known annealing for activation is performed in order to activate the implanted $BF_2^-$ ions.

Next, thermal oxidation or chemical vapor deposition is performed to form a sacrifice film 31 (part of which is shown in FIG. 3B) on the entire surface of the top silicon layer 13A. In this example, the sacrifice film 31 is assumed to be constructed of an oxide film or a laminate film of a nitride film and an oxide film.

Next, as shown in FIG. 3B, the well-known lithographic process with an electron beam or ultraviolet rays and an etching process are performed, forming an opening 30 that belongs to the sacrifice film 31 and is located in a region corresponding to the channel region described later.

Next, as shown in FIG. 3C, dry etching is performed using the sacrifice film 31 remaining on the surface of the top silicon layer 13A as a mask, by which a portion that belongs to the top silicon layer 13A and corresponds to the opening 30 is removed by about 1 nm in the direction of thickness in this example. Through this process, a channel region 32 of a thickness of 1 nm is formed in the region that belongs to the top silicon layer 13A and corresponds to the opening 30 is formed. On the other hand, portions 33 and 34 that belong to the top silicon layer 13 and are located adjacently on both sides of the channel region 32 remain having a thickness of 2 nm. The portions 33 and 34 are used as the source region and the drain region, respectively.

Next, thermal oxidation is performed similarly to the case shown in FIG. 1B, forming a gate oxide film 14 on the surface of the top silicon layer 13A. Subsequently, the processes are carried out until the metallic interconnection forming process similarly to the first embodiment.

In the fully inverted type SOI-MOSFET fabricated as described above, the thickness of the portion that belongs to the top silicon layer 13A and constitutes the source region 33 is made thicker than the thickness of the portion that constitutes the channel region 32. In this example, the portion that belongs to the top silicon layer 13A and constitutes the channel region 32 has a thickness of 1 nm equal to that of the first and second embodiments, whereas the portion that belongs to the top silicon layer 13A and constitutes the source region 33 has a thickness of 2 nm. As a result, the source resistance $R_S$ of the source region 33 satisfies the relation that $(1/g_m)>R_S$ with respect to the mutual conductance $g_m$ of the channel region 32 itself. Therefore, the effective mutual conductance $G_m$ becomes high on the basis of the aforementioned equation (1).

As described above, the fully inverted type SOI-MOSFET's of the first through third embodiments can obtain a high effective mutual conductance $G_m$ in a state in which a sub-threshold coefficient exhibits a small value close to the theoretical limit.

Moreover, in the fully inverted type SOI-MOSFET's of the first through third embodiments, the formation of silicide can be achieved in the wiring process. Furthermore, the integration process can be promoted, and the process margin can be widened, enabling the conventional etching process to be utilized. No special complex fabricating process is required to be added in order to fabricate the aforementioned fully inverted type SOI-MOSFET, and process control is also easy.

Although the fully inverted type SOI-MOSFET's of the first through third embodiments are each provided as the n-channel type, the same effect and operation can be produced even with the p-channel type. In the above case, a p-type impurity of boron or the like is employed as an impurity for the formation of the source/drain region.

With regard to the materials and the film thickness of the resist and the mask to be used in the lithographic process, those which are used in the general semiconductor fabricating process can be widely adopted. Furthermore, with regard to the lithographic system, there may be used an excimer laser, an X-ray laser or a synchrotron radiation light source as a source of light in place of electron beam exposure.

Moreover, each of the aforementioned embodiments adopts the so-called SOI substrate in which the embedded oxide film 12 is formed as the insulating layer on the surface of the silicon substrate 11 and the top silicon layer 13 or 13A that becomes the active region is further formed on the surface of the embedded oxide film 12. However, the present invention is not limited to this. It is only required that the top silicon layer 13 or 13A made of polysilicon or single-crystal silicon is provided on the substrate in an insulated state, and no limitation is imposed on the materials of the groundwork and the insulating layer. For example, it is acceptable to adopt the one that is formed by integrating the substrate with the insulating layer and in which the top silicon layer is provided directly on the surface of a glass substrate that has an insulating property.

In each of the aforementioned embodiments, the source region and the drain region are formed symmetrically (with symmetrical distributions of impurity concentration and thickness) on both sides of the channel region. However, the present invention is not limited to this. According to this invention, it is only required to satisfy the relation that $(1/g_m) > R_S$ with respect to the mutual conductance $g_m$ of the channel region itself, and no specific limitation is imposed on the drain region.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fully inverted type SOI-MOSFET comprising:
   a channel region in a top silicon layer, the top silicon layer being located under a gate electrode,
   a source region and a drain region also formed in the top silicon layer and located adjacent to the channel region, the channel region being inverted throughout the entire thickness thereof during operation, and
   wherein the source region has a source resistance ($R_S$) which satisfies a relation $(1/g_m) > R_S$ with respect to a mutual conductance ($g_m$) of the channel region itself.

2. A fully inverted type SOI-MOSFET as claimed in claim 1, wherein the source region has an impurity concentration set so that the source resistance ($R_S$) of the source region satisfies the relation that $(1/g_m) > R_S$ with respect to the mutual conductance ($g_m$) of the channel region itself.

3. A fully inverted type SOI-MOSFET as claimed in claim 1, wherein the source region comprises a diffusion layer including a metal therein so that the source resistance ($R_S$) of the source region satisfies the relation that $(1/g_m) > R_S$ with respect to the mutual conductance ($g_m$) of the channel region itself.

4. A fully inverted type SOI-MOSFET as claimed in claim 3, wherein the source region is made of metallic silicide.

5. A fully inverted type SOI-MOSFET as claimed in claim 4, wherein the metallic silicide is comprised of at least one of a group consisting of tantalum silicide, niobium silicide, chromium silicide, cobalt silicide, nickel silicide, zirconia silicide, vanadium silicide, hafnium silicide, molybdenum silicide and platinum silicide.

6. A fully inverted type SOI-MOSFET as claimed in claim 1, wherein a portion that belongs to the top silicon layer and constitutes the source region has a thickness greater than a thickness of a portion that constitutes the channel region so that the source resistance ($R_S$) of the source region satisfies the relation that $(1/g_m) > R_S$ with respect to the mutual conductance ($g_m$) of the channel region itself.

7. A fully inverted type SOI-MOSFET as claimed in claim 1, wherein a distance ($\Delta x$) in a direction of channel between a gate electrode and a metal contact in the source region is such that the source resistance ($R_S$) of the source region satisfies the relation that $(1/g_m) > R_S$ with respect to the mutual conductance ($g_m$) of the channel region itself.

8. The SOI-MOSFET of claim 1, further comprising means for causing the channel region to be inverted throughout the entire thickness thereof during operation of the SOI-MOSFET.

9. The SOI-MOSFET of claim 1, wherein the source region has a doping concentration of an impurity of from $1 \times 10^{20}$ to $1 \times 10^{21}$ cm$^{-3}$.

10. The SOI-MOSFET of claim 9, wherein the top silicon layer in which the source is located is from 1 to 5 nm thick.

11. The fully-inverted type SOI-MOSFET of claim 1, wherein the top silicon layer being not more than 10 nm thick so as to be inverted throughout its entire thickness during operation.

12. An inverted type SOI-MOSFET comprising:
    a channel region in a top silicon layer, the top silicon layer being located just under a gate electrode and the top silicon layer being not more than 10 nm thick so as to be inverted throughout its entire thickness during operation,
    a source region and a drain region also formed in the top silicon layer and located adjacent the channel region, and
    wherein the source region has a source resistance ($R_S$) which satisfies a relation $(1/g_m) > R_S$ with respect to a mutual conductance ($g_m$) of the channel region itself.

13. The SOI-MOSFET of claim 12, further comprising means for causing the channel region to be inverted throughout the entire thickness thereof during operation of the SOI-MOSFET.

14. The SOI-MOSFET of claim 12, wherein the source region has a doping concentration of an impurity of from $1 \times 10^{20}$ to $1 \times 10^{21}$ cm$^{-3}$.

15. The SOI-MOSFET of claim 12, wherein the top silicon layer in which the source is located is from 1 to 5 nm thick.

16. A SOI-MOSFET comprising:
    a channel region in a top silicon layer, the top silicon layer being located just under a gate electrode,
    a source region and a drain region formed in at least the top silicon layer and located adjacent the channel region, and
    wherein the source region has a source resistance ($R_S$) which satisfies a relation $(1/g_m) > R_S$ with respect to a mutual conductance ($g_m$) of the channel region itself.

* * * * *